(12) United States Patent
Lee et al.

(10) Patent No.: US 11,530,129 B2
(45) Date of Patent: Dec. 20, 2022

(54) MEMS MEMBRANE STRUCTURE AND METHOD OF FABRICATING SAME

(71) Applicant: KOREA ADVANCED INSTITUTE OF SCIENCE AND TECHNOLOGY, Daejeon (KR)

(72) Inventors: Boung Ju Lee, Daejeon (KR); Boo Taek Lim, Daejeon (KR)

(73) Assignee: KOREA ADVANCED INSTITUTE OF SCIENCE AND TECHNOLOGY, Daejeon (KR)

(\*) Notice: Subject to any disclaimer, the term of this patent is extended or adjusted under 35 U.S.C. 154(b) by 166 days.

(21) Appl. No.: 16/686,845

(22) Filed: Nov. 18, 2019

(65) Prior Publication Data

US 2020/0165123 A1 May 28, 2020

(51) Int. Cl.
*B81B 3/00* (2006.01)
*B81C 1/00* (2006.01)

(52) U.S. Cl.
CPC .......... *B81B 3/0081* (2013.01); *B81C 1/0069* (2013.01); *B81B 2203/0127* (2013.01); *B81C 2201/0109* (2013.01); *B81C 2201/0132* (2013.01)

(58) Field of Classification Search
CPC .......... B81B 3/0081; B81C 1/00182
See application file for complete search history.

(56) References Cited

U.S. PATENT DOCUMENTS

| 2013/0119822 A1\* | 5/2013 | Mao .......... B81C 1/00333 427/535 |
| 2016/0181212 A1\* | 6/2016 | Liu .......... H01L 24/02 257/621 |

\* cited by examiner

*Primary Examiner* — Moazzam Hossain
(74) *Attorney, Agent, or Firm* — Leydig, Voit & Mayer, Ltd.

(57) ABSTRACT

Disclosed is a method of fabricating a MEMS membrane structure. The method comprises: forming a silicon oxide film dam structure on a silicon substrate; depositing an adhesive layer and then forming a sacrificial layer; depositing a surface protective film on the sacrificial layer; etching the surface protective film and the sacrificial layer, thus forming trenches of first to third rows on the silicon oxide film dam structure; depositing a support film inside of the trenches of first to third rows and on the surface protective film of the sacrificial layer, thus forming a membrane; and removing the sacrificial layer disposed inside the support film deposited inside of the trench of first row, thus forming an empty space.

6 Claims, 4 Drawing Sheets

MEMS MEMBRANE STRUCTURE AND METHOD OF FABRICATING SAME

CROSS REFERENCE TO RELATED APPLICATION

The present application claims priority to Korean Patent Application No. 10-2018-0149849, filed Nov. 28, 2018, the entire contents of which is incorporated herein for all purposes by this reference.

FIELD

Disclosed is a MEMS membrane structure and a method of fabricating the same and, more particularly, a MEMS membrane structure improved in stability via a semiconductor process and a method of fabricating the same.

BACKGROUND

In general, surface micromachining technology based on a semiconductor integrated circuit manufacturing process of processing thin film material on a silicon substrate is used to fabricate a microelectromechanical systems (MEMS) device such as a microsensor and the like by fabricating a MEMS membrane structure on a silicon substrate and bonding the same to a semiconductor circuit. Herein, the MEMS membrane structure is freed from the substrate by removing an amorphous carbon film which is referred to as a sacrificial layer, thus forming an empty space.

However, the MEMS membrane structure in the related art is problematic in that the empty space formed by removing the sacrificial layer is low in height, thus making it difficult to ensure thermal stability of the upper MEMS device placed on the membrane, and causing a reduction in stability of the membrane structure.

The foregoing is intended merely to aid in the understanding of the background technology, and is not intended to mean that the invention falls within the purview of the related art that is already known to those skilled in the art.

SUMMARY

Accordingly, this disclosure has been made keeping in mind the above problems occurring in the related art, and an objective of the disclosure is to provide a MEMS membrane structure and a method of fabricating the same, wherein the membrane structure is improved in mechanical stability while a MEMS device on the membrane structure is improved in thermal stability.

In order to achieve the above object, according to one aspect of the disclosure, there is provided a method of fabricating a MEMS membrane structure, the method comprising: forming a silicon oxide film dam structure on a silicon substrate; depositing an adhesive layer and then forming a sacrificial layer; depositing a surface protective film on the sacrificial layer; etching the surface protective film and the sacrificial layer, thus forming trenches of first to third rows on the silicon oxide film dam structure; depositing a support film inside of the trenches of first to third rows and on the surface protective film of the sacrificial layer, thus forming a membrane; and removing the sacrificial layer disposed inside the support film deposited inside of the trench of first row, thus forming an empty space.

The silicon oxide film dam structure may be formed by depositing or growing a silicon oxide film.

The silicon oxide film dam structure may be formed in a polygonal or circular cylindrical shape.

The adhesive layer may be formed by depositing a silicon oxide film.

The sacrificial layer may be formed by forming an amorphous carbon layer flat on a surface of the substrate via a liquid spin-coating method.

The spin-coated amorphous carbon layer may be baked at a temperature of 200 to 400° C. for 1 to 10 minutes and then heat treated at a temperature of 300 to 400° C. for 10 to 50 minutes.

The sacrificial layer formed on the silicon oxide film dam structure by the trenches may be configured as a closed structure formed by connecting parts having a polygonal or circular cylindrical shape together.

The polygonal cylindrical shape may be one of quadrangular, hexagonal, and octagonal cylindrical shapes. The trenches may have a width of 1 to 2 μm.

The surface protective film may be formed by depositing a silicon oxide film.

The support film may be formed by forming a silicon oxide film or a silicon nitride film or laminating the silicon oxide film and the silicon nitride film together.

The method may further include forming a MEMS device on the membrane.

Furthermore, according to another aspect of the disclosure, there is provided a MEMS membrane structure, comprising: a silicon substrate; a silicon oxide film dam structure formed on the silicon substrate in a polygonal or circular cylindrical shape; a membrane formed by depositing a support film on a sacrificial layer and inside of trenches of first to third rows formed in a polygonal or circular cylindrical shape on the silicon oxide film dam structure; and an empty space formed by removing the sacrificial layer disposed inside the support film deposited inside of the trench of first row.

The MEMS membrane structure may further include an adhesive layer formed on the silicon oxide film dam structure.

The polygonal cylindrical shape may be one of quadrangular, hexagonal, and octagonal cylindrical shapes.

The sacrificial layer may be formed by forming an amorphous carbon layer flat on a surface of the substrate.

The support film may be formed by forming a silicon oxide film or a silicon nitride film or laminating the silicon oxide film and the silicon nitride film together.

The MEMS membrane structure may further include a MEMS device formed on the membrane.

As described above, according to an embodiment, the silicon oxide film dam structure is formed on the silicon substrate, and the trenches are arranged thereon, thus ensuring excellent filling characteristics in the trenches. This makes it possible to maintain mechanical stability of the membrane structure even under stress induced by temperature change.

Furthermore, according to an embodiment, the empty space which is formed by removing the sacrificial layer is increased in height, thus improving thermal stability of the MEMS device placed on the membrane.

BRIEF DESCRIPTION OF THE DRAWINGS

The above and other objects, features and advantages will be more clearly understood from the following detailed description when taken in conjunction with the accompanying drawings, in which.

DETAILED DESCRIPTION

Hereinbelow, exemplary embodiments will be described in detail with reference to the accompanying drawings such that the disclosure can be understood by one of ordinary skill in the relevant art. However, modifications to the following embodiments are possible and the scope of the present disclosure is not limited to the following embodiments.

A MEMS membrane structure and a method of fabricating the same according to an embodiment will be described in detail.

Figure 1A:
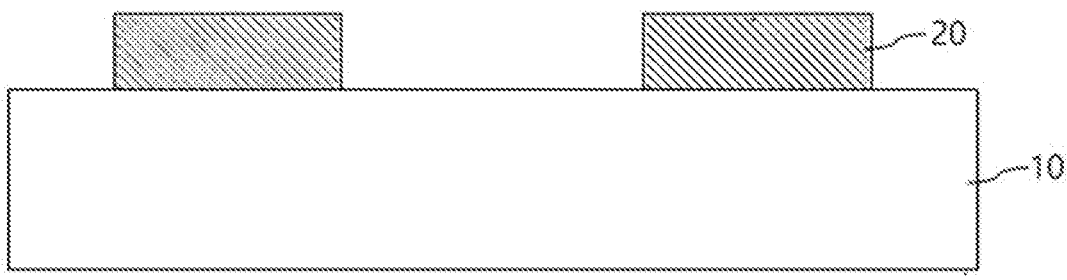
FIGS. 1A to 1G are cross-sectional views showing a process of fabricating a MEMS membrane structure according to an embodiment.
Figure 1B:
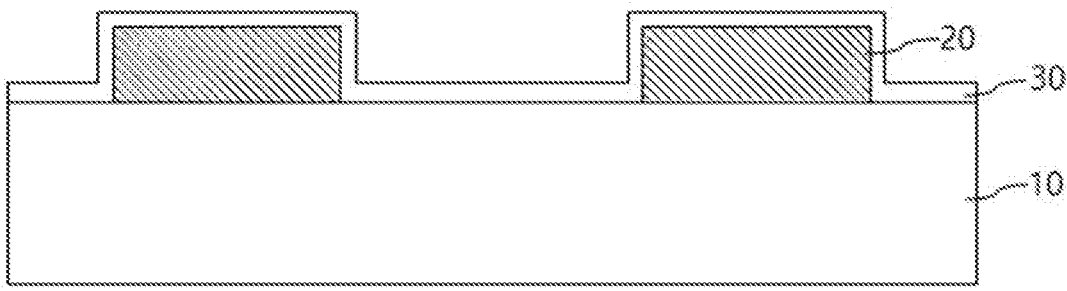
Figure 1C:
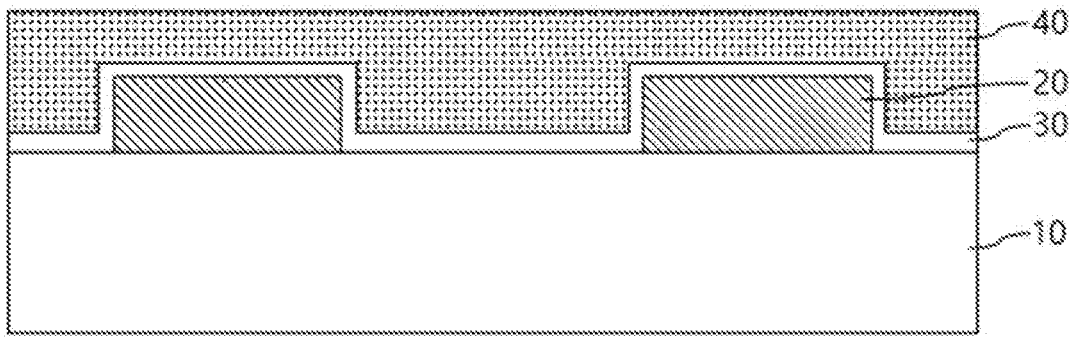
Figure 1D:
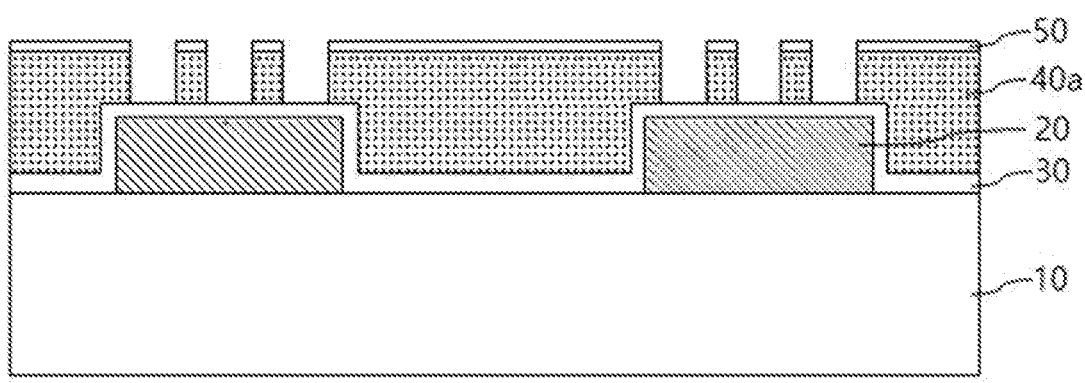
Figure 1E:
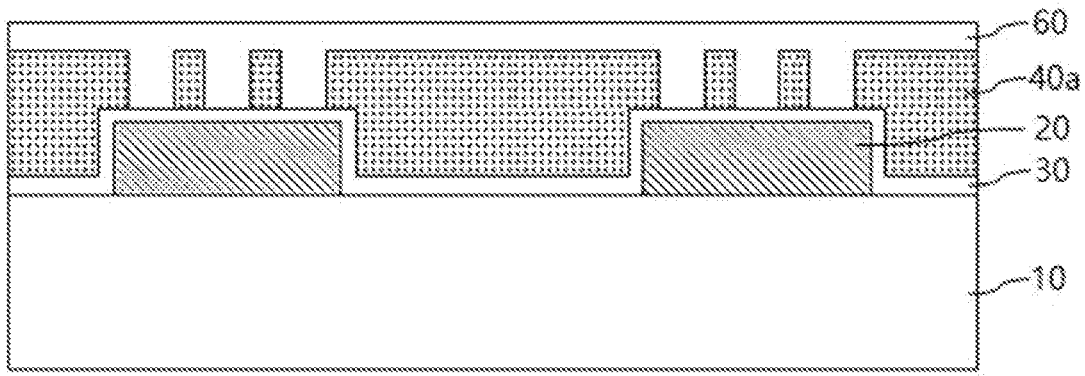
Figure 1F:
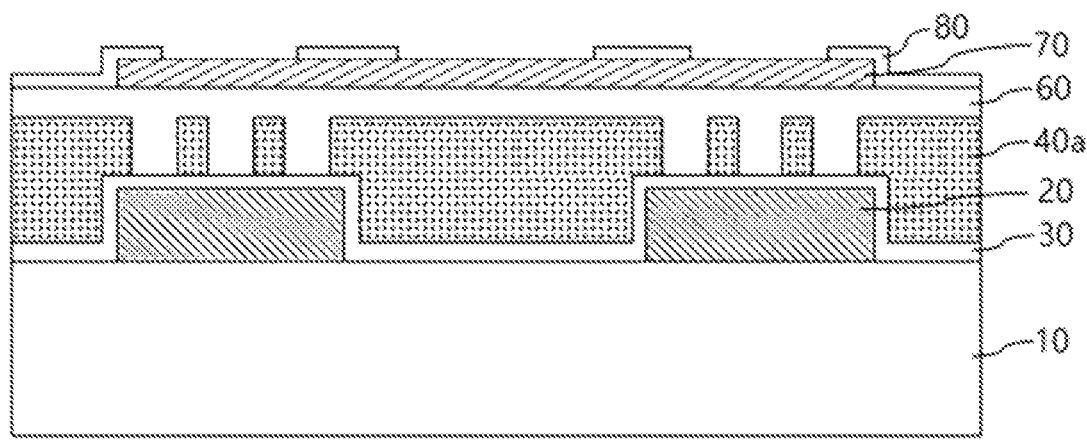
Figure 1G:
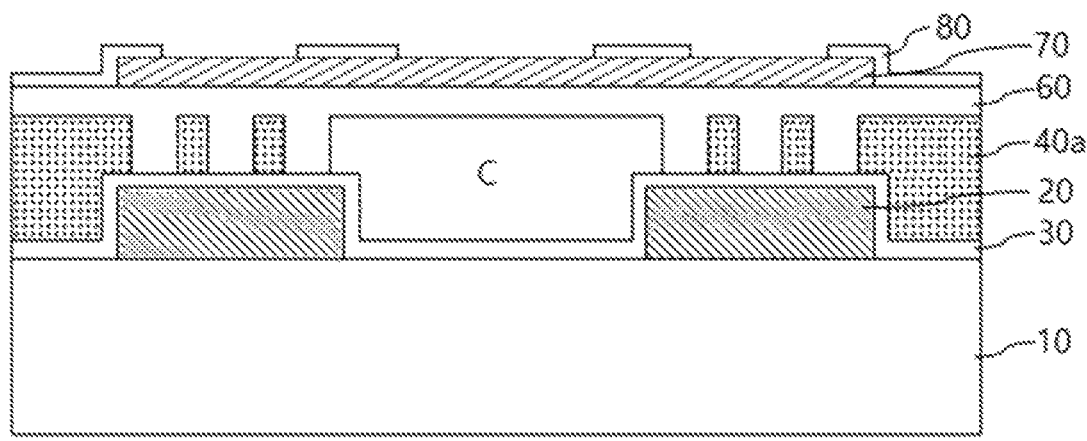
Figure 2:
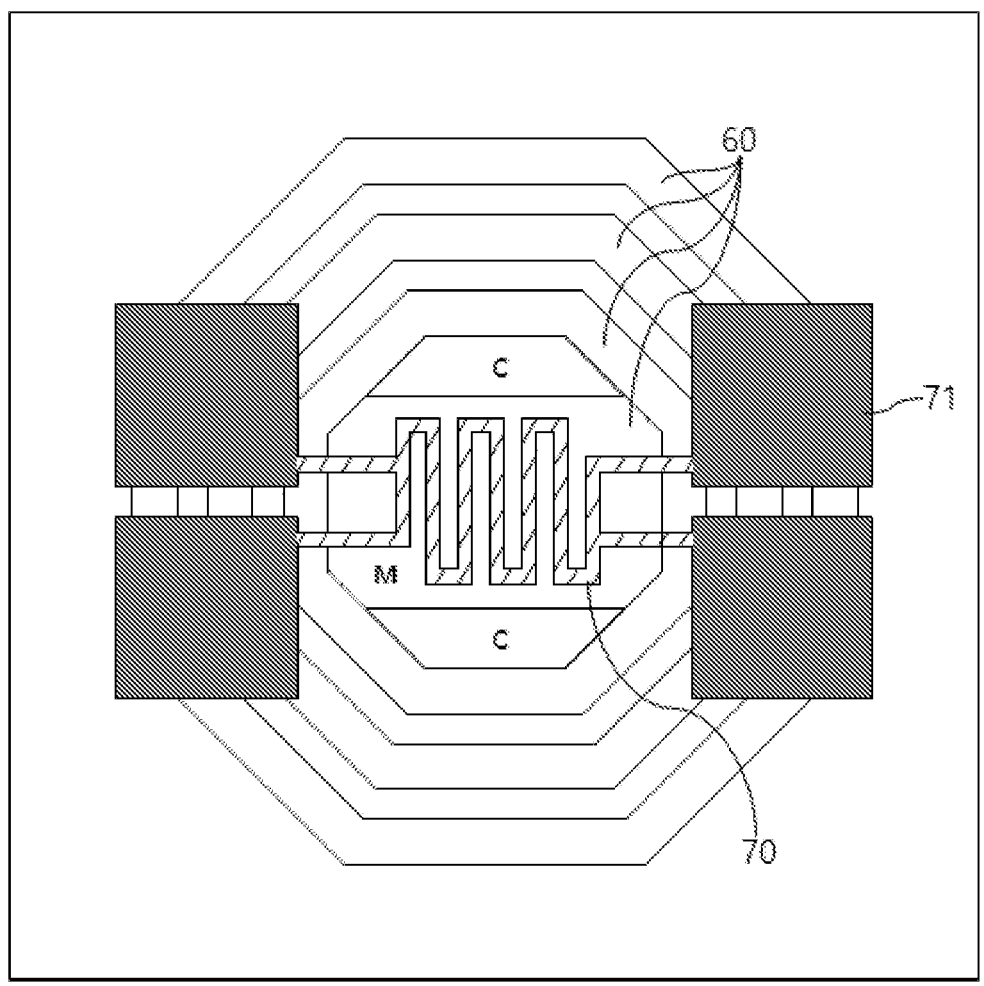
FIG. 2 is a plan view showing the MEMS membrane structure according to an embodiment and a MEMS device formed thereon.

FIGS. 1A to 1G are cross-sectional views showing a process of fabricating the MEMS membrane structure according to an embodiment; and FIG. 2 is a plan view showing the MEMS membrane structure according to an embodiment and a MEMS device formed thereon.

The process of fabricating the MEMS membrane structure will be described. First, referring to FIG. 1A, a silicon oxide film is deposited or grown on a silicon substrate 10, and then a silicon oxide film dam structure 20 with a height of several micrometers μm and a width of several to several tens of micrometers μm is formed via exposure and etching processes. Herein, the silicon oxide film dam structure 20 is formed in a polygonal or circular cylindrical shape, preferably a quadrangular, hexagonal, octagonal, or circular cylindrical shape.

Thereafter, referring to FIG. 1B, a silicon oxide film with a thickness of several tens to several hundreds nanometers nm, which serves as an adhesive layer 30, is deposited on the entire surface of the substrate via a chemical vapor deposition (hereinafter referred to as "CVD") method.

Thereafter, referring to FIG. 1C, an amorphous carbon layer with a thickness of several micrometers μm, which serves as a sacrificial layer 40, is formed on the adhesive layer 30 via a liquid spin-coating method and is baked at a temperature of 200 to 400° C. for several minutes, preferably for 1 to 10 minutes and then heat treated at a temperature of 300 to 400° C. for several tens of minutes, preferably for 10 to 50 minutes.

Thereafter, referring to FIG. 1D, a silicon oxide film with a thickness of several tens to several hundreds of nanometers nm, which serves as a surface protective film 50, is deposited via the CVD method and then a trench is formed in the sacrificial layer 40 on the silicon oxide film dam structure 20 via exposure and etching processes. Herein, the trench is formed as trenches of first to third rows, but is not limited thereto. The trenches have a width of 1 to 2 μm.

Herein, a sacrificial layer 40a formed by the trenches is configured as a closed structure formed by connecting parts having a polygonal or circular cylindrical shape together. The polygonal cylindrical shape may be one of quadrangular, hexagonal, and octagonal cylindrical shapes.

Thereafter, referring to FIG. 1E, a support film 60 is deposited on the surface protective film 50 of the sacrificial layer 40a and inside of the trenches of first to third rows. Herein, the support film 60 with a thickness of 0.5 to 2 μm is formed by depositing a silicon oxide film or a silicon nitride film or by depositing a composite film via the CVD method, the composite film being comprised of the silicon oxide film and the silicon nitride film which are laminated together.

Herein, the support film 60 serves as a membrane M of the MEMS structure, and the depth of the trench is lowered by the help of the silicon oxide film dam structure 20 thereunder, thus improving filling characteristics and thus securing mechanical stability of the membrane structure. Furthermore, the support film 60 serves as an upper protective film of the sacrificial layer 40a and serves to support the upper MEMS device so as to ensure stability against stress due to operation.

Thereafter, referring to FIG. 1F, the MEMS device 70 such as a microheater, a gas sensor, and the like and a pad portion 71 are formed on the support film 60 and then a protective film 80 is formed. Herein, the protective film 80 with a thickness of 0.5 to 3 μm is formed by depositing a silicon oxide film or a silicon nitride film or depositing a composite film via the CVD method, the composite film being comprised of the silicon oxide film and the silicon nitride film which are laminated together.

Thereafter, referring to FIG. 1G, a part of the protective film 80 and a part of the support film 60 are selectively removed via exposure and etching processes as shown in FIG. 2 to expose the sacrificial layer 40a on the surface of the substrate, and then the amorphous carbon layer as the sacrificial layer 40a under the membrane M is removed via an oxygen ($O_2$) plasma stripping process which is dry etching, thus forming an empty space C. In other words, only the amorphous carbon layer, which is the sacrificial layer 40a disposed inside the support film 60 of a polygonal or circular cylindrical shape having a closed structure filled in a trench line of first row, is selectively removed, thus forming a freestanding membrane M structure while the remaining sacrificial layer 40a is left. This makes it possible for the upper MEMS device to maintain stability against mechanical stress.

As described above in the foregoing embodiments, improvement of the filling characteristics in the trenches can increase the thickness of the sacrificial layer and the height of the empty space C from which the sacrificial layer is removed. As a result, the upper MEMS device 70 is excellent in heat retention characteristics, leading to an improvement of thermal stability and device characteristics of the upper MEMS device 70.

Although exemplary embodiments have been described for illustrative purposes, those skilled in the art will appreciate that various modifications, additions and substitutions are possible, without departing from the scope and spirit of the disclosure as defined by the appended claims.

What is claimed is:

1. A MEMS membrane structure, comprising:
    a silicon substrate;
    a silicon oxide film dam structure formed on the silicon substrate in a polygonal or circular cylindrical shape;
    a membrane formed by depositing a support film on a sacrificial layer and inside of a plurality of trenches formed from the sacrificial layer in a polygonal or circular cylindrical shape on top of the silicon oxide film dam structure; and
    an empty space formed by removing only a central portion of the sacrificial layer disposed inside the support film deposited between the plurality of trenches, and the portions of the sacrificial layer surrounding the trenches remain.

2. The MEMS membrane structure of claim 1, further comprising:

an adhesive layer formed on the silicon oxide film dam structure.

3. The MEMS membrane structure of claim 1, wherein the polygonal cylindrical shape is one of quadrangular, hexagonal, and octagonal cylindrical shapes.

4. The MEMS membrane structure of claim 1, wherein the sacrificial layer is formed by forming an amorphous carbon layer flat on a surface of the substrate.

5. The MEMS membrane structure of claim 1, wherein the support film is formed by forming a silicon oxide film or a silicon nitride film or laminating the silicon oxide film and the silicon nitride film together.

6. The MEMS membrane structure of claim 1, further comprising:
   a MEMS device formed on the membrane.

\* \* \* \* \*